United States Patent [19]

Ienaga et al.

[11] Patent Number: 5,442,206

[45] Date of Patent: Aug. 15, 1995

[54] LAY-OUT STRUCTURE OF POWER SOURCE POTENTIAL LINES AND GRAND POTENTIAL LINES FOR SEMICONDUCTOR INTEGRATED CIRCUIT

[75] Inventors: Takashi Ienaga; Tomoko Kai, both of Kanagawa, Japan

[73] Assignee: NEC Corporation, Tokyo, Japan

[21] Appl. No.: 240,549

[22] Filed: May 11, 1994

[30] Foreign Application Priority Data

May 11, 1993 [JP] Japan .................................. 5-108643

[51] Int. Cl.6 ...................... H01L 27/02; H01L 27/10; H01L 23/48
[52] U.S. Cl. ..................................... 257/207; 257/691
[58] Field of Search ................. 257/207, 208, 202, 691

[56] References Cited

U.S. PATENT DOCUMENTS

| | | | |
|---|---|---|---|
| 4,811,073 | 3/1989 | Kitamura et al. | 257/207 |
| 4,989,062 | 1/1991 | Takahashi et al. | 257/207 |
| 5,343,058 | 8/1994 | Shifter, II | 257/207 |
| 5,391,900 | 2/1995 | Onodera et al. | 257/207 |

OTHER PUBLICATIONS

By M. Watanabe, "Very Large Scale Integrated Circuit Design —A Top–down Approach to Custom VLSI–", Sep. 10, 1983, pp. 338–344, Japan, with English translation.

Primary Examiner—Sara W. Crane
Assistant Examiner—S. V. Clark
Attorney, Agent, or Firm—Young & Thompson

[57] ABSTRACT

Among power supply lines for the standard cells provided nearby the corner part of an outer peripheral power supply line (the grand potential, for example) of a macro cell, the power supply line of the power source potential, for example, is connected to an inner peripheral power supply line (the power source potential) through an auxiliary power supply line provided on said corner part. The auxiliary power supply line is formed in L-shape with the first metal layer line and the perpendicular extending second metal layer line connected each other through a contact. Further, the first metal layer line of the auxiliary power supply line is provided so as to cross over the second metal layer line of the outer peripheral power supply line with an insulating layer therebetween. Therefore, the auxiliary power supply line can connect the inner peripheral power supply line and the power source potential line for the standard cell without electrical contact with the outer peripheral power supply line. Therefore, according to the present invention, all of the power supply lines can be connected each other by the automated lay-out technique without occurrence of short and manual modification, therefore the time course required for semiconductor integrated circuit development can be shortened.

4 Claims, 6 Drawing Sheets

LAY-OUT STRUCTURE OF POWER SOURCE POTENTIAL LINES AND GRAND POTENTIAL LINES FOR SEMICONDUCTOR INTEGRATED CIRCUIT

BACKGROUND OF THE INVENTION

1. Field of the Invention

The present invention relates to a semiconductor integrated circuit wherein macro cell and standard cells are mixed in, and more particularly to a lay-out structure of power source potential lines and grand potential lines for a semiconductor integrated circuit which is effective for arrangement of these power supply lines between a macro cell and a standard cell by using an automated lay-out technique.

2. Prior Art

In the automated design technique of lay-out for semiconductor integrated circuits wherein macro cell and standard cells are mixed in, a peripheral power supply line is provided manually on the peripheral part of the macro cell in order to connect a power source potential line and a grand potential line to the standard cell and the macro cell.

FIG. 1 is a diagram showing a whole lay-out of such semiconductor integrated circuit according to the prior art wherein a macro cell and standard cells are mixed in. In this semiconductor integrated circuit, a macro cell 30 and a plurality of standard cells 31 are provided.

In the peripheral part of the macro cell 30, a peripheral power supply line 40 and another peripheral power supply line 41 inner thereof are provided. One of these peripheral power supply lines 40 and 41 is used for supply of the power source potential and the other for the grand potential. These peripheral power supply lines 40 and 41 are sufficiently wide to tolerate as the power source potential lines and grand potential lines. Further, all of these peripheral power supply lines 40 and 41 are constituted by first metal layer lines 32 and second metal layer lines 33 which are extending perpendicular to each other. The first metal layer lines 32 is formed by patterning a metal layer on an insulating layer provided on the macro cell 30 and extending toward one direction and the second metal layer lines 33 is formed by patterning a metal layer on an insulating layer provided on the first metal layer line 32 in such a way that the lines 33 extend perpendicular to the first metal layer line 32. The first metal layer line 32 and the second metal layer line 33 are connected through contacts 43.

A plurality of standard cells 31 are arranged laterally to constitute a row of standard cell and a plurality of rows of these standard cells 31 are arranged parallel to each other. Lines 42 supplying power source potential and grand potential to each row of the standard cells 31 are arranged so as to extend perpendicular to the row of the standard cells. These power supply lines 42 are also formed by the second metal layer line 33. Each power supply line 42 formed by the second metal layer line 33 is connected to the manually arranged peripheral power supply lines 40 and 41 which is formed by the first metal layer lines 32 and the second metal layer lines 33, using automated lay-out technique.

FIG. 2 is a lay-out diagram showing enlarged corner part of the macro cell 30. FIG. 2 is an enlarged drawing showing area X indicated by dotted line in FIG. 1. As shown in FIG. 2, power supply lines 44 and 45, power supply lines 46 and 47, or power supply lines 48 and 49 extending laterally are formed by the first metal layer lines 32 for each standard cell row. These power supply lines 44 and 45, 46 and 47 and 48 and 49 are connected to the power supply lines 42 through contacts.

In case the peripheral power supply line 40 is for a power source potential, the peripheral power supply line 41 is for a grand potential, the standard cell power supply lines 44, 46 and 48 are for a power source potential and the standard cell power supply lines 45, 47 and 49 are for a grand potential, the power source lines 44, 46 and 48 must be connected to the outer peripheral power supply line 40 through contacts 43, and the power supply lines 45, 47 and 49 to the inner peripheral power supply line 41 through contacts 43.

When the scale of macro cell 30 is increased, however, the width of peripheral power supply lines 40 and 41 must be expanded accordingly. But, as shown in FIG. 2, if the width of peripheral power supply line 40 is expanded too much to exceed the space between the power supply line 44 supplying the power source potential and the power supply line 45 supplying the grand potential for the standard cell 31, short circuit may occur between the peripheral power supply line 40 of the macro cell 30 and the power supply line 45 of the standard cell 31 at the corner part of the peripheral power supply line 40. That is, the standard cell grand line 45 located nearby the corner part of the peripheral power supply line 40 and the peripheral power supply line 40 for the power source potential may contact each other at the part 35 to form short circuit.

In FIG. 2, the power supply lines 44, 46, 47, 48 and 49 can be connected either to the peripheral power supply line 40 for the power source potential or to the peripheral power supply line 41 for the grand potential by extending straight toward its direction. However, if the power supply line 45 were arranged as it is, the first metal layer line 32 of the peripheral power supply line 40 for the power source potential and the first metal layer line 32 of the power source line 45 for the grand potential, which are formed by patterning the metal layer of the same level, may short each other due to technical limitation of the automated lay-out only allowing extension of the metal line toward one direction.

Therefore, in order to avoid the short circuit formation, as shown in FIG. 3, the first metal layer line 32 is cut off at the connection part of the power supply line 45 with the peripheral power supply line 40. Also, as shown in FIG. 4, the power supply line 45 may be cut off at the same connection part and then the tip of this line 45 and the power supply line 47 for the grand potential which is provided for the adjoining standard cell 31 may be connected by a line 37 using the second metal layer line 33 crossing over the first metal layer line 32 as shown in FIG. 4.

Thus, in the prior art, either cutting off of the line 45 or connecting the line 45 to the line 47 was made to avoid the short circuit formation, in either case the line arrangement was manually modified. Therefore, the line lay-out technique according to the prior art has defect that the line arrangement must be manually modified and the design turn around time (TAT) deteriorates because the line connection is changed after the automated lay-out is completed.

SUMMARY OF THE INVENTION

The object of the present invention is to provide a lay-out structure of power source potential lines and grand potential lines for semiconductor integrated circuits, wherein any short circuit of lines can be avoided to occur, any manual modification of power source lines is not required, automated lay-out design can be implemented, the time course of developmental stage can be shortened by eliminating any manual modification.

A lay-out structure of power source potential lines and grand potential lines for a semiconductor integrated circuit according to the present invention comprises: inner and outer peripheral power supply lines provided for said macro cell. Each peripheral power supply line has first metal layer lines extending towards one direction, second metal layer lines forming a layered line structure with said first metal layer lines including an insulating layer between the first and the second metal layer lines for electrical insulation and extending towards the direction crossing to said first metal layer line, and contacts connecting said first and said second metal layer lines. A plurality of pairs of power supply lines are provided for said standard cells. Each power supply line of said standard cells has first metal layer line or second metal layer line extending parallel to said first metal layer line or said second metal layer line for said inner and outer peripheral power supply lines, respectively. An auxiliary power supply line has a first metal layer line and a second metal layer line extending parallel to said first metal layer line and said second metal layer line for said inner and outer peripheral power supply lines, respectively. Said auxiliary power supply line is not electrically contacted with said outer peripheral power supply line and one end thereof is connected to said inner peripheral power supply line and another end thereof extends to the outside of the outer peripheral power supply line and is connected to one or more of said power supply lines for said standard cells.

According to the present invention, any short circuit which may occur between a power source potential line or a grand potential line of standard cells and peripheral power supply lines in the prior art can be avoided. Further, any manual modification of power source lines can be eliminated and therefore the time course of developmental stage can be shortened since auxiliary power supply lines can be connected to power supply lines for the standard cells and peripheral power supply lines by the automated lay-out technique.

BRIEF DESCRIPTION OF THE DRAWINGS

FIG. 1 is a diagram showing a prior art automated lay-out structure of semiconductor integrated circuit wherein a macro cell and standard cells are mixed in.

DETAILED DESCRIPTION OF THE PREFERRED EMBODIMENTS

Figure 1:
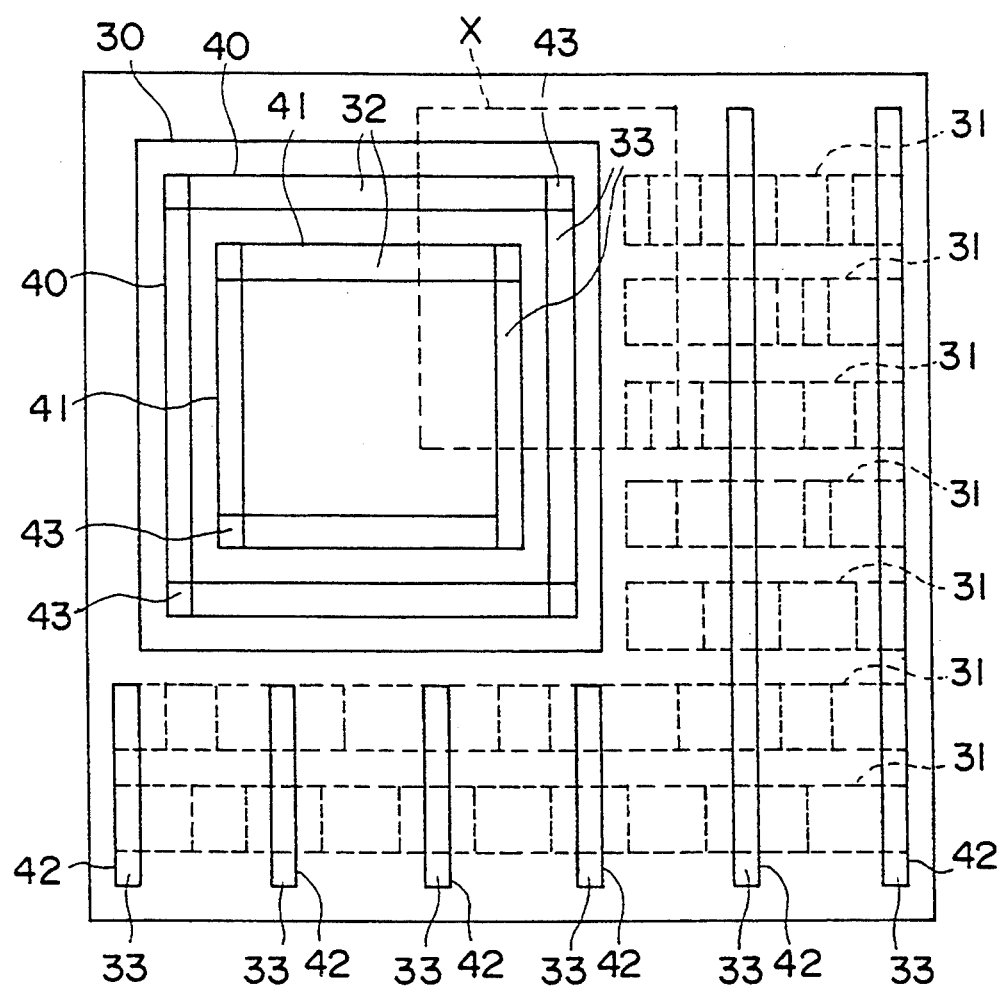
Figure 2:
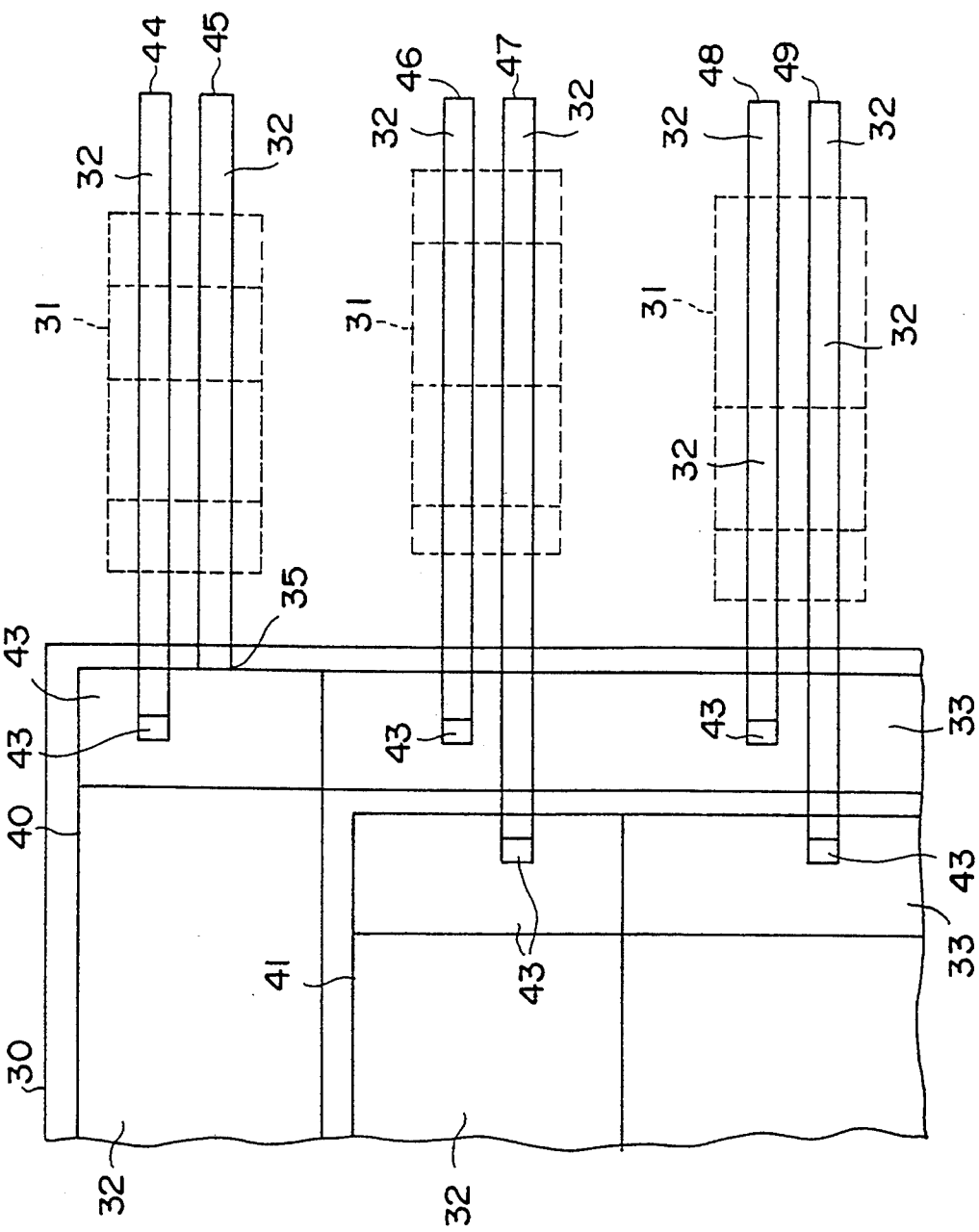
FIG. 2 is an enlarged diagram of the part shown by dotted line X in FIG. 1.
Figure 3:
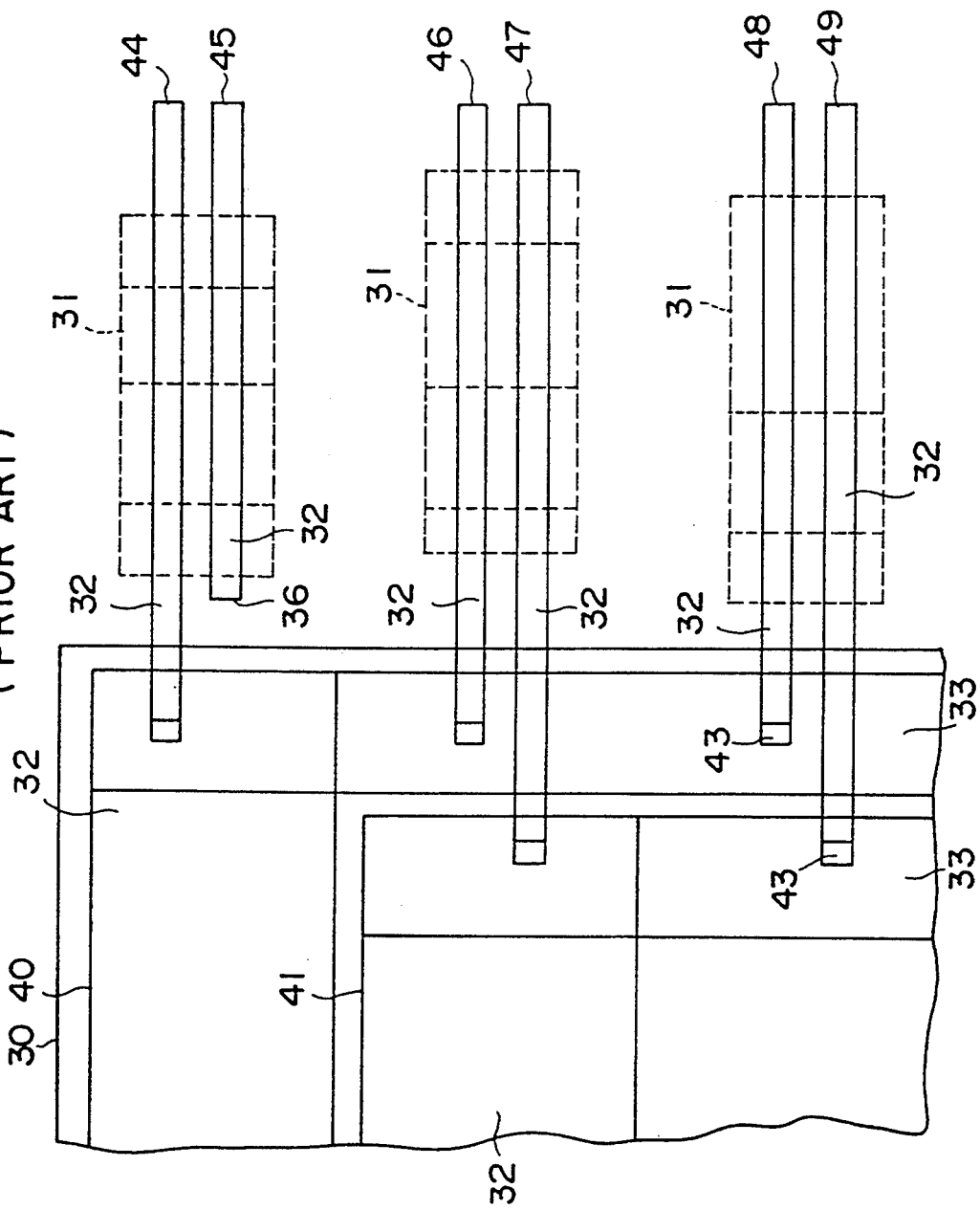
FIG. 3 is a diagram showing the power supply connection part of automated lay-out wherein a macro cell and standard cells are mixed in and the power supply connection part is cut off in order to prevent short circuit formation according to the prior art.
Figure 4:
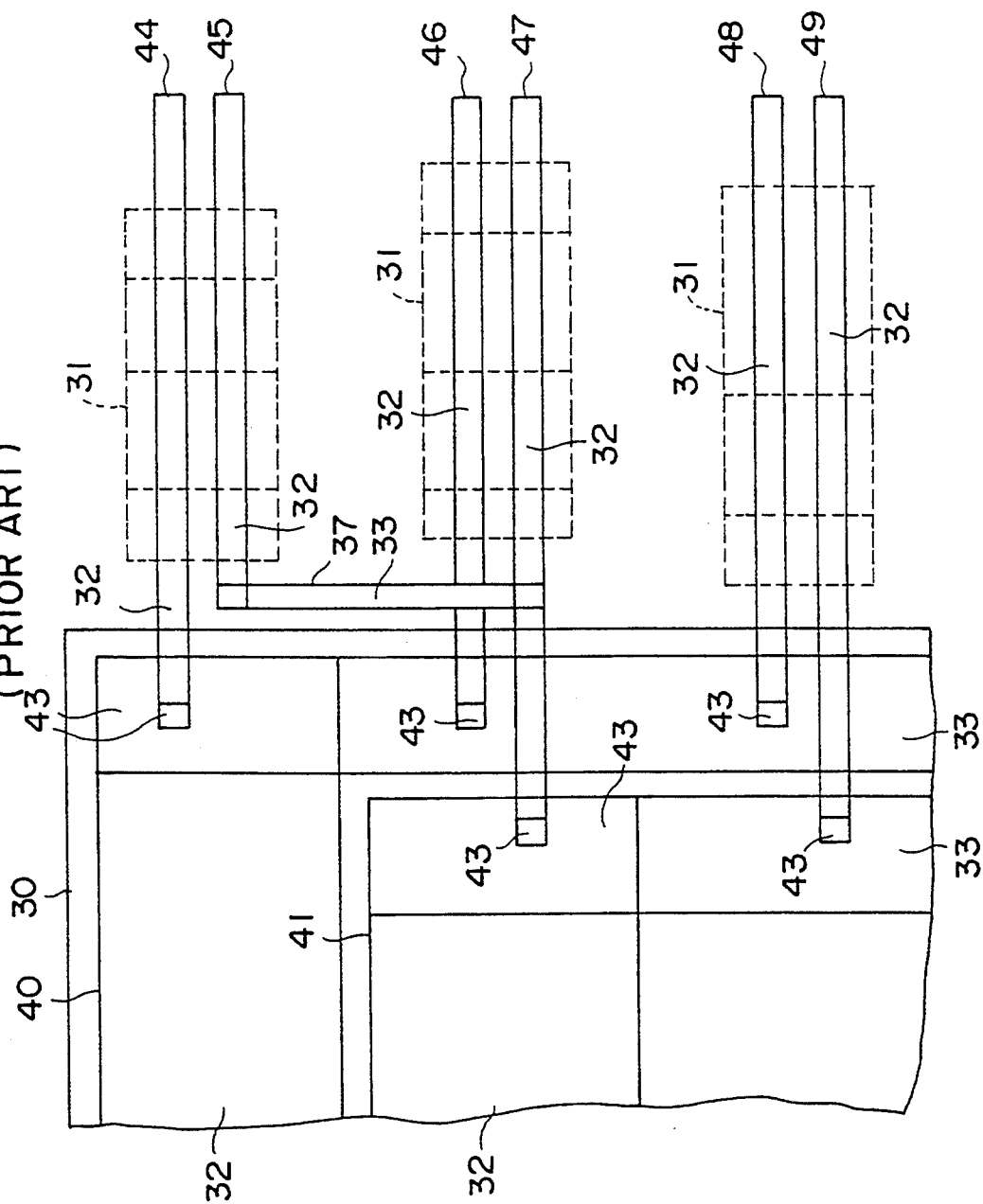
FIG. 4 is a diagram showing the power supply connection part of automated lay-out wherein a macro cell and standard cells are mixed in and the power supply connection part is connected to another power supply line in order to prevent short circuit formation according to the prior art.
Figure 5:
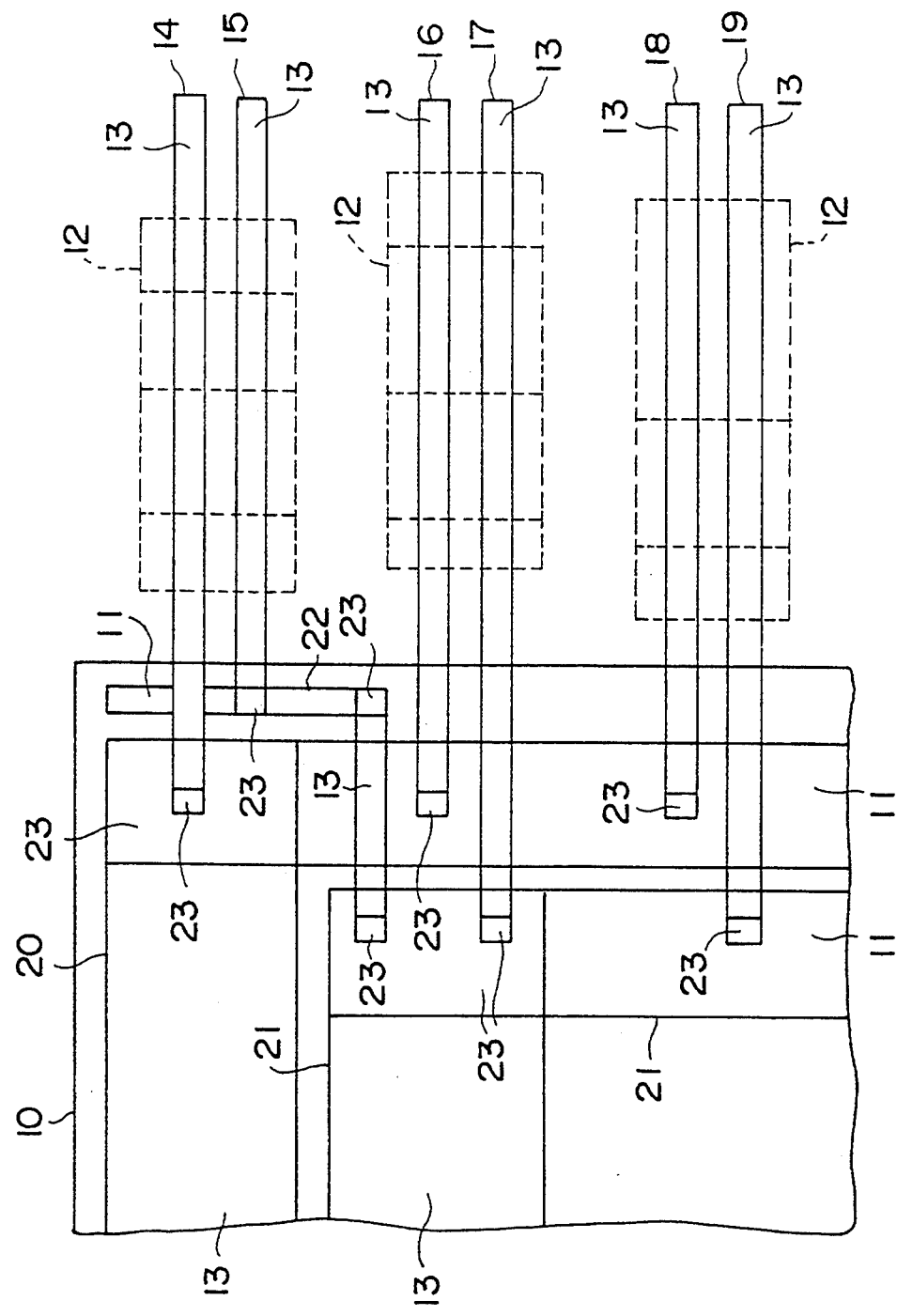
FIG. 5 is a diagram showing the lay-out structure of the first embodiment according to the present invention.

FIG. 5 is a diagram showing the first embodiment according to the present invention. FIG. 5 shows only the corner part of the macro cell 10 and the standard cells 12 nearby. A plurality of standard cells 12 are placed laterally to form a standard cell row. Three rows of the standard cells 12 are shown in FIG. 5.

In the macro cell 10, an outer peripheral power supply line 20 and the inner peripheral power supply line 21 are provided in the peripheral part thereof.

These peripheral power supply lines 20 and 21 are formed by first metal layer lines 13 extending towards lateral direction and second metal layer lines 11 extending perpendicular to the first metal layer lines 13. These first metal layer lines 13 and the second metal layer lines 11 are connected at the corner part by contacts 23. The first metal layer lines 13 are formed on an insulating layer provided on the second metal layer lines 11. That is, the second metal layer line 11 can be formed, for example, by forming an aluminum layer (a second metal layer) followed by patterning thereof, and the first metal layer line 13 can be formed by forming another insulating layer on the second metal layer lines 11 followed by further forming an aluminum layer (a first metal layer) thereon then by patterning thereof. Details will be explained later, but the first metal layer lines 13 and the second metal layer line 11 constituting power supply lines 14 to 19 and an auxiliary power supply line 22 are also formed at the same level as the first metal layer lines 13 and the second metal layer line 11 forming the peripheral power supply lines 20 and 21, respectively. That is, in each of the lines, the first metal layer lines 13 extending laterally are formed by patterning of said first metal layer and the second metal layer lines 11 extending perpendicular to the first metal layer lines 13 is formed by patterning of said second metal layer. In this embodiment, the inner peripheral power supply line 21 is for the power source potential and the outer peripheral power supply line 20 is for the grand potential.

In the standard cells 12, power supply lines 14 and 15, power supply lines 16 and 17 and power supply lines 18 and 19 formed by the first metal layer lines 13 extending laterally are arranged for each standard cell row. In this embodiment, lines 14, 16 and 18 are for the grand potential, and lines 15, 17 and 19 are for the power source potential.

Among the lines 16, 17, 18 and 19 for the standard cells 12 not located nearby the corner part of the outer peripheral power supply line 20, the lines 16 and 18 are connected to the outer peripheral power supply line 20 through the contacts 23, the lines 17 and 19 are connected to the inner peripheral power supply line 21 through the contacts 23. Thus, all of the power source potential lines are connected each other and, also all of the grand potential lines are connected each other.

The auxiliary power supply line 22 is provided nearby the corner part of the outer peripheral power supply line 20. This auxiliary power supply line 22 is formed in L-shape by connecting the first metal layer line 13 extending laterally and the second metal layer line 11 extending perpendicular to the first metal layer line 13 at the end part thereof by the contact 23. The second metal layer line 11 of the auxiliary power supply line 22 is formed in the peripheral area of the macro cell 10 slightly apart outwardly from the first metal layer line 11 of the outer peripheral power supply line 20 but in parallel therefor, and the first metal layer line 13 of the auxiliary power supply line 22 is formed above the macro cell 10 slightly apart from the first metal layer line 13 of the outer peripheral power supply line 20 but in parallel therefor. The power source potential line 15 of the standard cell 12 is connected to the vertically extending second metal layer line 11 of the auxiliary power supply line 22 through the contact 23. On the other hand, the laterally extending first metal layer line 13 of the auxiliary power supply line 22 crosses over the second metal layer line 11 of the outer peripheral power supply line 20 and connected to the inner peripheral power supply line 21 at the end thereof through the contact 23. Therefore, the line 15 is connected to the inner peripheral power supply line 21 for the power source potential through this auxiliary power supply line 22.

Further, the power supply line 14 for the grand potential is connected to the outer peripheral power supply line 20 through the contact 23 by extending the first metal layer line 13 laterally.

Thus, the lines 14, 16 and 18 of the grand potential are connected to the outer peripheral power supply line 20 of the grand potential by extending the first metal layer line 13 as it is, and the lines 17 and 19 of the power source potential are connected to the inner peripheral power supply line 21 of the power source potential by extending the first metal layer-line 13 as it is. Meantime, the line 15 of the power source potential is connected to the inner peripheral power supply line 21 of the power source potential through the auxiliary power supply line 22 provided on the insulating layer so as to cross over the outer peripheral power supply line 20.

By this arrangement, the line 15 can be connected to the inner peripheral power supply line 21 preventing short with the outer peripheral power supply line 20. Further, because the connection of the auxiliary power supply line 22 with the line 15 and the inner power supply line 21 can be designed by the automated lay-out technique, any manual modification of lines is not required and the automated lay-out of line connection can be realized, therefore the time course required for semiconductor integrated circuit development can be shortened.

Figure 6:
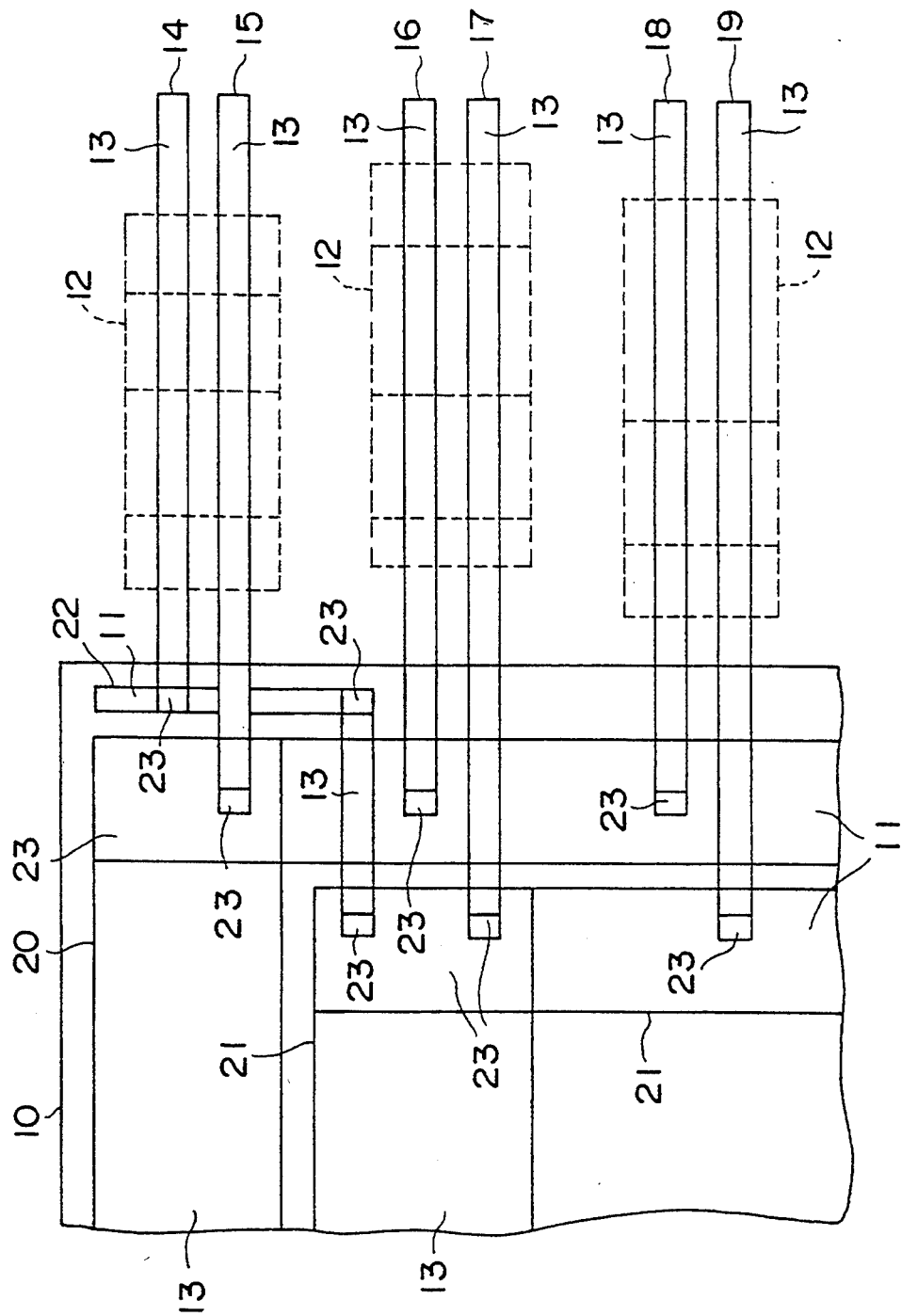
FIG. 6 is a diagram showing the lay-out structure of the second embodiment according to the present invention.

FIG. 6 is a diagram showing the second embodiment according to the present invention. In this embodiment, the inner peripheral power supply line 21 is for the grand potential and the outer peripheral power supply line 20 is for the power source potential. In this case, the line 15 as the power source potential is connected to the outer peripheral power supply line 20 by extending the first metal layer line 13 as it is and the line 14 as the grand potential is connected to the inner peripheral power supply line 21 through the auxiliary power supply line 22 in the row of the standard cells 12 provided nearby the corner part of the outer peripheral power supply line 20.

This embodiment has the same effect as the embodiment shown in FIG. 5.

What is claimed is:

1. A lay-out structure of power source potential lines and grand potential lines for a semiconductor integrated circuit wherein a macro cell and standard cells are mixed in, inner and outer peripheral power supply lines provided for said macro cell, each peripheral power supply line having first metal layer lines extending towards one direction, second metal layer lines forming a layered line structure with said first metal layer lines including an insulating layer between the first and the second metal layer lines for electrical insulation and extending towards the direction crossing to said first metal layer line, and contacts connecting said first and said second metal layer lines, a plurality of pairs of power supply lines provided for said standard cells, each power supply line having first metal layer line or second metal layer line extending parallel to said first metal layer line or said second metal layer line for said inner and outer peripheral power supply lines, respectively, and an auxiliary power supply line having a first metal layer line and a second metal layer line extending parallel to said first metal layer line and said second metal layer line for said inner and outer peripheral power supply lines, respectively, said auxiliary power supply line being not electrically contacted with said outer peripheral power supply line and one end thereof being connected to said inner peripheral power supply line and another end thereof extending to the outside of the outer peripheral power supply line and being connected to one or more of said power supply lines for said standard cells.

2. The lay-out structure of power source potential lines and grand potential lines for a semiconductor integrated circuit according to claim 1, wherein;

said inner peripheral power supply line is to supply the power source potential and said outer peripheral power supply line is to supply the grand potential, one or more power supply lines of said standard cells for supplying the power source potential is (are) connected to said inner peripheral power supply line through said auxiliary power supply line.

3. The lay-out structure of power source potential lines and grand potential lines for a semiconductor integrated circuit according to claim 1, wherein;

said inner peripheral power supply line is to supply the grand potential and said outer peripheral power supply line is to supply the power source potential, one or more power supply lines of said standard cells for supplying the grand potential is (are) connected to said inner peripheral power supply line through said auxiliary power supply line.

4. The lay-out structure of power source potential lines and grand potential lines for a semiconductor integrated circuit according to claim 1, wherein;

said second metal layer line of said auxiliary power supply line is provided above the peripheral area of said macro cell, apart outwardly from and in parallel with the second metal layer line of said outer peripheral power supply line, and said first metal layer line of said auxiliary power supply line is provided above the peripheral area of said macro cell, apart from and in parallel with the first metal layer line of said outer peripheral power supply line.

* * * * *